(12) United States Patent
Nakano et al.

(10) Patent No.: US 12,417,928 B2
(45) Date of Patent: Sep. 16, 2025

(54) SUBSTRATE PROCESSING METHOD AND SUBSTRATE PROCESSING SYSTEM

(71) Applicant: Tokyo Electron Limited, Tokyo (JP)

(72) Inventors: Takeo Nakano, Nirasaki (JP); Hirokazu Ueda, Osaka (JP); Mitsuaki Iwashita, Nirasaki (JP); Ryuichi Asako, Nirasaki (JP); Naoki Umeshita, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 18/096,144

(22) Filed: Jan. 12, 2023

(65) Prior Publication Data

US 2023/0230855 A1 Jul. 20, 2023

(30) Foreign Application Priority Data

Jan. 19, 2022 (JP) .................. 2022-006660

(51) Int. Cl.
*H01L 21/56* (2006.01)
*H01L 21/67* (2006.01)

(52) U.S. Cl.
CPC ........ *H01L 21/56* (2013.01); *H01L 21/67126* (2013.01)

(58) Field of Classification Search
CPC .................................................. H01L 212/56

USPC ........................................................ 427/421.1
See application file for complete search history.

(56) References Cited

U.S. PATENT DOCUMENTS

| | | | | |
|---|---|---|---|---|
| 3,624,459 | A * | 11/1971 | Brown, Jr. ............. | H01G 9/022 29/25.03 |
| 7,842,336 | B2 * | 11/2010 | Park .................. | G02F 1/133516 427/162 |
| 2006/0113509 | A1 | 6/2006 | Norenberg et al. | |
| 2006/0172091 | A1 * | 8/2006 | Tung .................. | G02F 1/133711 427/535 |
| 2008/0248263 | A1 * | 10/2008 | Kobrin .............. | C23C 16/45514 427/255.28 |
| 2014/0061902 | A1 * | 3/2014 | Ramalingam ..... | H01L 23/49816 257/738 |
| 2019/0316256 | A1 * | 10/2019 | Bhuyan .................... | C23C 16/04 |
| 2021/0404594 | A1 * | 12/2021 | Hanson .................. | B82Y 40/00 |

FOREIGN PATENT DOCUMENTS

WO 2021220883 A1 11/2021

\* cited by examiner

*Primary Examiner* — Brian K Talbot
(74) *Attorney, Agent, or Firm* — Nath, Goldberg & Meyer; Jerald L. Meyer; Tanya E. Harkins

(57) ABSTRACT

A substrate processing method includes: preparing a substrate having a metal film exposed on a surface of the substrate; and forming a film of an ionic self-association material on a surface of the metal film by supplying the ionic self-association material to the surface of the substrate, the ionic self-association material having fluidity with a hydrophilic group and a hydrophobic group.

9 Claims, 12 Drawing Sheets

$t = 1.4 \; \mu s$

SUBSTRATE PROCESSING METHOD AND SUBSTRATE PROCESSING SYSTEM

CROSS-REFERENCE TO RELATED APPLICATION

This application is based upon and claims the benefit of priority from Japanese Patent Application No. 2022-006660, filed on Jan. 19, 2022, the entire contents of which are incorporated herein by reference.

TECHNICAL FIELD

The present disclosure relates to a substrate processing method and a substrate processing system.

BACKGROUND

A technique in which a liquid material including an ionic liquid is applied onto a substrate to form a protective film is known (e.g., see Patent Document 1).

PRIOR ART DOCUMENT

Patent Document

International Publication No. 2021/220883

SUMMARY

According to one embodiment of the present disclosure, a substrate processing method includes preparing a substrate having a metal film exposed on a surface of the substrate; and forming a film of an ionic self-association material on a surface of the metal film by supplying the ionic self-association material to the surface of the substrate, the ionic self-association material having fluidity with a hydrophilic group and a hydrophobic group.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
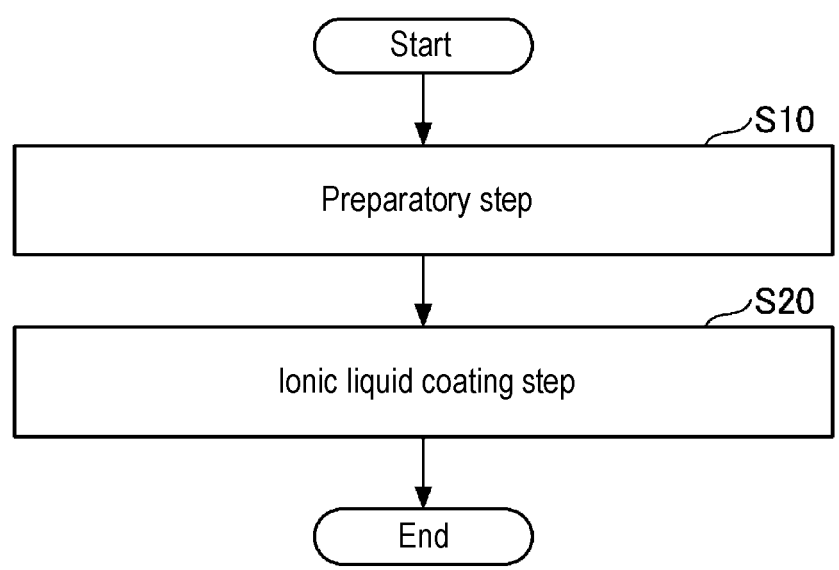
FIG. 1 is a flowchart illustrating a substrate processing method according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant descriptions thereof will be omitted.

[Substrate Processing Method]

A substrate processing method according to an embodiment will be described with reference to FIGS. 1, 2A and 2B. As illustrated in FIG. 1, the substrate processing method according to the embodiment includes a preparatory step S10 and an ionic liquid coating step S20.

Figure 2A:
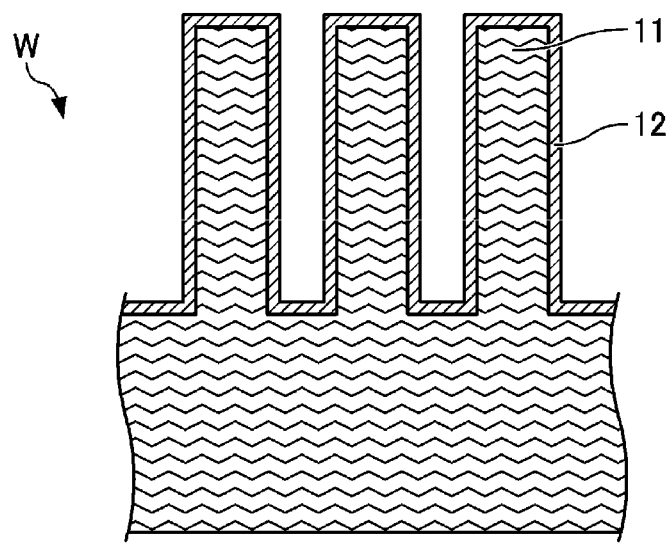
FIGS. 2A and 2B are cross-sectional views illustrating the substrate processing method according to the embodiment.

The preparatory step S10 includes preparing a substrate W having a pattern 11 covered with a metal film 12 on a surface thereof (see FIG. 2A). The substrate W is, for example, a semiconductor wafer. The pattern 11 is, for example, a trench or a hole. The metal film 12 may be, for example, a copper (Cu) film or an aluminum (Al) film. The metal film 12 is formed by, for example, a chemical vapor deposition (CVD) method or a physical vapor deposition (PVD) method such as a sputtering method. However, the method of forming the metal film 12 is not limited thereto. The substrate processing method may include removing a natural oxide film on the surface of the substrate W before and/or after the formation of the metal film.

Figure 2B:
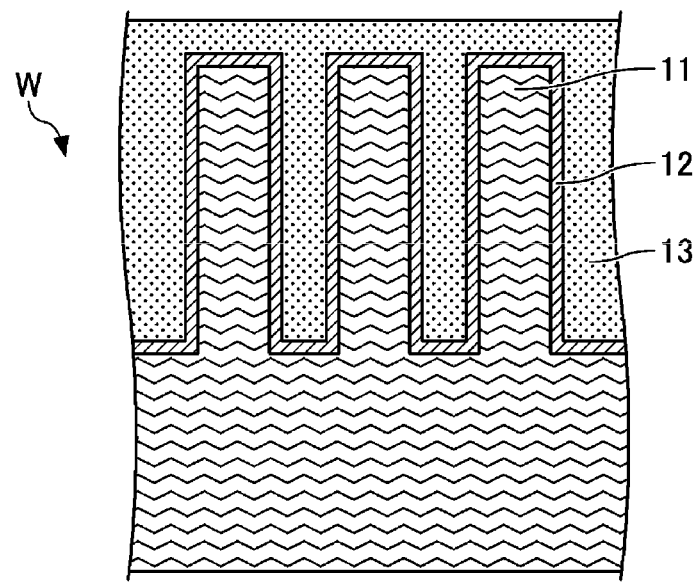

The ionic liquid coating step S20 includes forming a film 13 of an ionic liquid on the surface of the metal film 12 by supplying, to the surface of the substrate W, a first ionic liquid and a second ionic liquid that do not mix spontaneously (see FIG. 2B). The first ionic liquid and the second ionic liquid are solidified on the surface of the substrate W and also enter the pattern 11 formed on the surface of the substrate W, thereby forming the ionic liquid film 13. Since the first ionic liquid and the second ionic liquid do not mix spontaneously, the first ionic liquid and the second ionic liquid form molecular cluster groups, respectively, and are separated from each other, thereby maintaining the properties of an independent ionic liquid in the ionic liquid film 13. The first ionic liquid and the second ionic liquid have different specific gravities, which results in an arrangement in which the molecular cluster group formed by the first ionic liquid and the molecular cluster group formed by the second ionic liquid are vertically stacked in the ionic liquid film 13.

In addition, "do not mix spontaneously" includes the case of "do not mix spontaneously" and the case of "almost do not mix spontaneously." "Do not mix spontaneously" means a state where the first ionic liquid and the second ionic liquid are separated as molecular clusters in the ionic liquid film 13. For example, if the radius of the Hansen sphere of the first ionic liquid and the second ionic liquid is 10 MPa$^{1/2}$ or more, it is difficult for the first ionic liquid and the second ionic liquid to mix spontaneously. If the radius of the Hansen sphere of the first ionic liquid and the second ionic liquid is 20 MPa$^{1/2}$ or more, it is difficult for the first ionic liquid and the second ionic liquid to mix more spontaneously. Therefore, the radius of the Hansen sphere of the first ionic liquid and the second ionic liquid is preferably 10 MPa$^{1/2}$ or more, and more preferably 20 MPa$^{1/2}$ or more.

The radius $R_a$ of a Hansen sphere is a value calculated by the following equation (1) when the Hansen solubility parameter of the first ionic liquid is ($\delta_{d1}$, $\delta_{p1}$, $\delta_{h1}$) and the Hansen solubility parameter of the second ionic liquid is ($\delta_{d2}$, $\delta_{p2}$, $\delta_{h2}$).

$$R_a = \{4(\delta_{d1}-\delta_{d2})^2 + (\delta_{p1}-\delta_{p2})^2 + (\delta_{h1}-\delta_{h2})^2\}^{1/2} \quad (1)$$

The first ionic liquid is an ionic liquid that adsorbs water ($H_2O$) but does not take oxygen ($O_2$) (hereinafter referred to as "hydrophilic ionic liquid"). The second ionic liquid is an ionic liquid that adsorbs oxygen but does not take water (hereinafter referred to as "hydrophobic ionic liquid"). Thereby, even when the substrate W is exposed to an environment including water and oxygen, oxygen is prevented from reaching the metal film 12 by the molecular cluster group formed by the first ionic liquid in the ionic liquid film 13. Further, water is prevented from reaching the metal film 12 by the molecular cluster group formed by the second ionic liquid in the ionic liquid film 13. That is, the ionic liquid film 13 functions as a protective film for water and oxygen, thus preventing water and oxygen from reaching the metal film 12. As a result, corrosion of the surface of the metal film 12 may be prevented.

In the ionic liquid coating step S20, the first ionic liquid and the second ionic liquid may be supplied from a same nozzle, or may be supplied from different nozzles. However, in order to properly manage two or more kinds of ionic liquids, it is preferable to simultaneously supply the first ionic liquid and the second ionic liquid from different nozzles.

As the first ionic liquid and the second ionic liquid, a combination of a hydrophilic ionic liquid and a hydrophobic ionic liquid that do not mix spontaneously may be used. The first ionic liquid may include one or two or more hydrophilic ionic liquids, and the second ionic liquid may include one or two or more hydrophobic ionic liquids.

Examples of the hydrophilic ionic liquid may include DEME-BF$_4$ (N,N-diethyl-N-methyl-N-(2-methoxyethyl) ammoniumtetrafluoroborate), EMIm-TFA (1-ethyl-3-methylimidazoliumtrifluoromethanesulfonate), EMIm-AcO (1-ethyl-3-methylimidazoliumacetate), MEMP-alanine (N-(2-methoxyethyl)-N-methylpyrrolidiniumalanine), MEMP-BF(CN)$_3$(N-(2-methoxyethyl)-N-methylpyrrolidiniumtricyanofluoroborate), and EMIm-NO$_3$ (1-ethyl-3-methylimidazoliumnitrate). However, the hydrophilic ionic liquid is not limited thereto.

Examples of the hydrophobic ionic liquid may include BHDP-DSS (trihexyltetradecylphosphonium3-(trimethylsilyl)-1-propanesulfonate), BDDP-DSS (tridodecyltetradecylphosphonium3-(trimethylsilyl)-1-propanesulfonate), MEMP-TFSA (N-(2-methoxyethyl)-N-methylpyrrolidiniumbis(trifluoromethanesulfonyl) amide), MEMP-FSA (N-2-methoxyethyl)-N-methylpyrrolidiniumbis(fluorosulfonyl) amide), and P13-FSA (N-methyl-N-propylpyrrolidiniumbis (fluorosulfonyl) amide). However, the hydrophobic ionic liquid is not limited thereto.

As described above, with the substrate processing method according to the embodiment, the ionic liquid film 13 is formed on the surface of the metal film 12 by supplying the hydrophilic first ionic liquid and the hydrophobic second ionic liquid that do not mix spontaneously to the surface of the substrate W. Since the first ionic liquid and the second ionic liquid do not mix spontaneously, the first ionic liquid and the second ionic liquid form molecular cluster groups, respectively, and are separated from each other in the ionic liquid film 13, thereby maintaining the properties of an independent ionic liquid. Further, the first ionic liquid and the second ionic liquid have different specific gravities, which results in an arrangement in which the molecular cluster group formed by the first ionic liquid and the molecular cluster group formed by the second ionic liquid are vertically stacked in the ionic liquid film 13. Thereby, even when the substrate W is exposed to an environment containing water and oxygen, oxygen is prevented from reaching the metal film 12 by the molecular cluster group formed by the first ionic liquid in the ionic liquid film 13. Further, water is prevented from reaching the metal film 12 by the molecular cluster group formed by the second ionic liquid in the ionic liquid film 13. That is, the ionic liquid film 13 functions as a protective film for water and oxygen, thus preventing water and oxygen from reaching the metal film 12. As a result, corrosion of the surface of the metal film 12 may be prevented.

On the other hand, a case where the ionic liquid film 13 is formed on the surface of the metal film 12 by supplying only a hydrophilic ionic liquid without supplying a hydrophobic ionic liquid to the surface of the substrate W will be considered. In this case, oxygen is not taken into the ionic liquid film 13 and does not reach the surface of the metal film 12, but the ionic liquid containing water reaches the surface of the metal film 12. Therefore, the metal film 12 may be corroded.

Further, a case where the ionic liquid film 13 is formed on the surface of the metal film 12 by supplying only a hydrophobic ionic liquid without supplying a hydrophilic ionic liquid to the surface of the substrate W will be considered. In this case, water is not taken into the ionic liquid film 13 and does not reach the surface of the metal film 12, but the ionic liquid containing oxygen reaches the surface of the metal film 12. Therefore, the metal film 12 may be corroded.

Further, a case where the ionic liquid film 13 is formed on the surface of the metal film 12 by supplying a hydrophilic ionic liquid and a hydrophobic ionic liquid that mix spontaneously to the surface of the substrate W will be considered. In this case, molecules of the hydrophilic ionic liquid and molecules of the hydrophobic ionic liquid are in a mixed state and do not maintain the properties of an independent ionic liquid in the ionic liquid film 13, so that at least one of the hydrophilic ionic liquid including water and the hydrophobic ionic liquid including oxygen may reach the surface of the metal film 12. Therefore, the metal film 12 may be corroded.

[Coating Device]

Figure 3:
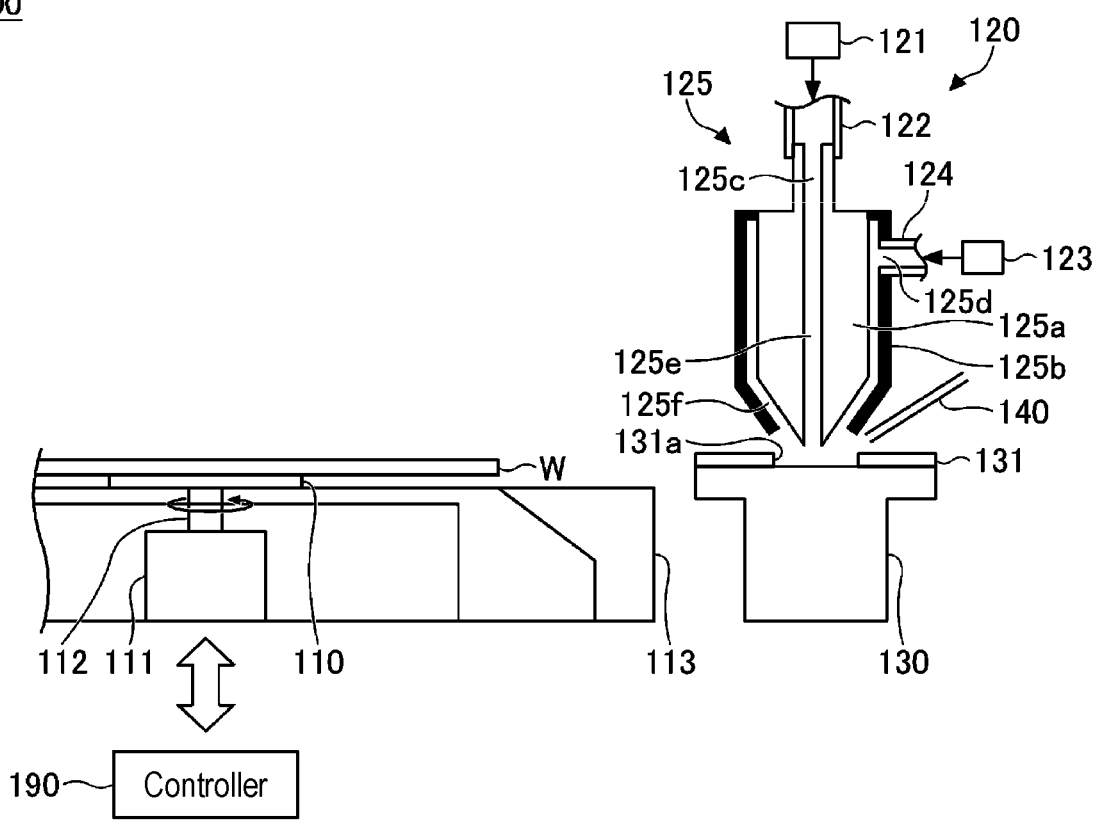
FIG. 3 is a schematic diagram illustrating an example of a coating device.

A slit coater 100, which is an example of a coating device capable of performing the ionic liquid coating step S20 of the substrate processing method according to the embodiment, will be described with reference to FIG. 3.

The slit coater 100 includes a stage 110, a liquid supply 120, a sub-stage 130, a concentration measurement nozzle 140, and a controller 190.

The stage 110 mounts the substrate W in a substantially horizontal state. The stage 110 is connected to the upper end of a rotating shaft 112 which is rotated by a drive mechanism 111, and thus, is rotatably configured. A liquid receiver 113 having an open top side is provided around the bottom of the stage 110. The liquid receiver 113 receives a liquid material or the like that overflows or is shaken off from the substrate W.

The liquid supply 120 includes a first ionic liquid supply source 121, a first ionic liquid supply pipe 122, a second ionic liquid supply source 123, a second ionic liquid supply pipe 124, and a slit nozzle 125.

The first ionic liquid supply source 121 supplies the first ionic liquid to the slit nozzle 125 through the first ionic liquid supply pipe 122. The first ionic liquid may be the above-described hydrophilic ionic liquid.

The first ionic liquid supply pipe 122 is a pipe that supplies the first ionic liquid from the first ionic liquid supply source 121 to the slit nozzle 125. The first ionic liquid supply pipe 122 is formed of, for example, a conductive member.

The second ionic liquid supply source 123 supplies the second ionic liquid to the slit nozzle 125 through the second ionic liquid supply pipe 124. The second ionic liquid may be the above-described hydrophobic ionic liquid.

The second ionic liquid supply pipe 124 is a pipe that supplies the second ionic liquid from the second ionic liquid supply source 123 to the slit nozzle 125. The second ionic liquid supply pipe 124 is formed of, for example, a conductive member.

The slit nozzle 125 supplies the first ionic liquid and the second ionic liquid to the surface of the substrate W mounted on the stage 110 by horizontally moving above the substrate W. Further, the slit nozzle 125 supplies the first ionic liquid and the second ionic liquid onto the sub-stage 130 by moving to the top of the sub-stage 130. The slit nozzle 125 includes a main body 125a, a shell 125b, a first ionic liquid supply port 125c, and a second ionic liquid supply port 125d.

The main body 125a has a first ionic liquid flow path 125e therein. The first ionic liquid flow path 125e is connected to the first ionic liquid supply pipe 122 through the first ionic liquid supply port 125c formed in an upper portion of the main body 125a. Thereby, the first ionic liquid from the first ionic liquid supply source 121 is supplied to the first ionic liquid flow path 125e through the first ionic liquid supply pipe 122 and the first ionic liquid supply port 125c, and is discharged from a lower end of the first ionic liquid flow path 125e. The main body 125a is formed of, for example, an insulating member. The flow-path cross-sectional area of the first ionic liquid flow path 125e is optimized according to the viscosity and the contact angle (wettability) of the first ionic liquid.

The shell 125b is provided outside the main body 125a so as to form a second ionic liquid flow path 125f between the outer surface of the main body 125a and the shell 125b. The second ionic liquid flow path 125f is connected to the second ionic liquid supply pipe 124 through the second ionic liquid supply port 125d. Thereby, the second ionic liquid from the second ionic liquid supply source 123 is supplied to the second ionic liquid flow path 125f through the second ionic liquid supply pipe 124 and the second ionic liquid supply port 125d, and is discharged from a lower end of the second ionic liquid flow path 125f. The shell 125b is formed of, for example, a conductive member. The flow-path cross-sectional area of the second ionic liquid flow path 125f is optimized according to the viscosity and the contact angle (wettability) of the second ionic liquid.

In this way, the slit nozzle 125 has a double-layered piping structure including the first ionic liquid flow path 125e and the second ionic liquid flow path 125f which are formed by the main body 125a and the shell 125b. Thereby, the first ionic liquid and the second ionic liquid may be applied with one slit nozzle 125.

The sub-stage 130 is provided separately from the stage 110 at a position where the liquid supply 120 may apply the first ionic liquid and the second ionic liquid. In the example of FIG. 3, the sub-stage 130 is provided at a lateral side of the stage 110. A plate-shaped member 131, which has an opening 131a in a region to which the first ionic liquid and the second ionic liquid are applied, is provided on an upper surface of the sub-stage 130. The sub-stage 130 is configured such that the temperature of the upper surface thereof may be adjusted by a heater or a cooler. The heater may be, for example, a heater embedded within the sub-stage 130. The cooler may be, for example, a coolant flow path formed within the sub-stage 130.

The concentration measurement nozzle 140 is formed of, for example, a tubular member. The concentration measurement nozzle 140 is provided at a position where one end thereof comes into contact with the first ionic liquid and the second ionic liquid applied onto the sub-stage 130. Thereby, when the first ionic liquid and the second ionic liquid are applied onto the sub-stage 130 by the liquid supply 120, a part of the applied first ionic liquid and second ionic liquid is sucked up from one end of the tubular member. That is, a part of the first ionic liquid and the second ionic liquid applied onto the sub-stage 130 by the liquid supply 120 may be collected by the concentration measurement nozzle 140. The concentrations of the first ionic liquid and the second ionic liquid may be checked by performing various measurements on the first ionic liquid and the second ionic liquid collected by the concentration measurement nozzle 140. Examples of these various measurements may include a measurement of a specific resistance in which an electrode needle comes into contact with an ionic liquid, a measurement by a chromatography method, and an optical measurement including FT-IR using a spectrometer.

The controller 190 controls each element of the slit coater 100. For example, the controller 190 processes a computer-executable instruction that causes the slit coater 100 to execute the ionic liquid coating step S20. The controller 190 may be configured to control each element of the slit coater 100 so as to execute the ionic liquid coating step S20. The controller 190 includes, for example, a computer. The computer includes, for example, a CPU, a storage, and a communication interface.

[Substrate Processing System]

Figure 4:
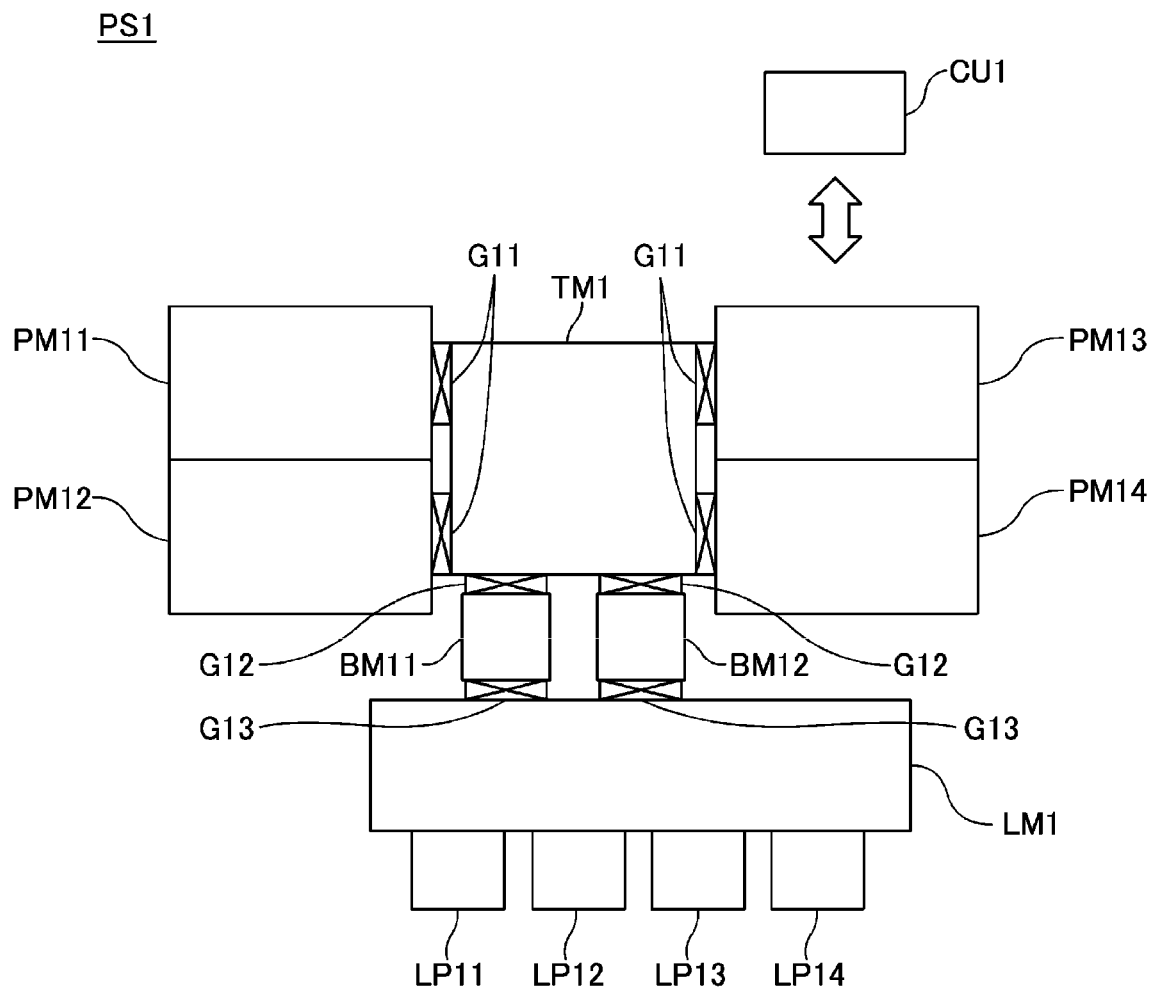
FIG. 4 is a schematic diagram illustrating one example of a substrate processing system.

An example of a substrate processing system capable of performing the substrate processing method according to the embodiment will be described with reference to FIG. 4. As illustrated in FIG. 4, a substrate processing system PS1 is configured as an atmospheric apparatus.

The substrate processing system PS1 includes an atmospheric transport module TM1, process modules PM11 to PM14, buffer modules BM11 and BM12, a loader module LM1, and the like.

The atmospheric transport module TM1 has a substantially rectangular shape in a plan view. The atmospheric transport module TM1 is connected at two opposite side surfaces thereof to the process modules PM11 to PM14. The buffer modules BM11 and BM12 are connected to one side surface of the other two opposite side surfaces of the atmospheric transport module TM1. The atmospheric transport module TM1 has a transport chamber under an inert gas environment, and a transport robot (not illustrated) is disposed therein. The transport robot is configured to be pivotable, extendable/retractable, and movable up and down. The transport robot transports the substrate W based on an operation instruction output by a controller CU1 to be described later. For example, the transport robot holds the substrate W with a fork disposed at a tip thereof, and transports the substrate W among the buffer modules BM11 and BM12 and the process modules PM11 to PM14. In addition, the fork is also called a pick or an end effector.

Each of the process modules PM11 to PM14 has a processing chamber and a stage (not illustrated) is disposed therein. The process modules PM11 to PM14 include the slit coater 100 described above. The process modules PM11 to PM14 may include devices other than the slit coater 100. The atmospheric transport module TM1 and the process modules PM11 to PM14 are partitioned by gate valves G11 that may be opened and closed.

The buffer modules BM11 and BM12 are arranged between the atmospheric transport module TM1 and the loader module LM1. Each of the buffer modules BM11 and BM12 has a stage disposed therein. The substrate W is transferred between the atmospheric transport module TM1 and the loader module LM1 via the buffer modules BM11 and BM12. The buffer modules BM11 and BM12 and the atmospheric transport module TM1 are partitioned by gate valves G12 that may be opened and closed. The buffer modules BM11 and BM12 and the loader module LM1 are partitioned by gate valves G13 that may be opened and closed.

The loader module LM1 is arranged opposite to the atmospheric transport module TM1. The loader module LM1 is, for example, an equipment front end module (EFEM). The loader module LM1 has a rectangular parallelepiped shape, includes a fan filter unit (FFU), and is an atmospheric transport chamber maintained under an atmospheric pressure environment. Two buffer modules BM11 and BM12 are connected to one longitudinal side surface of the loader module LM1. Load ports LP11 to LP14 are connected to the other longitudinal side surface of the loader module LM1. A container (not illustrated) that accommodates multiple substrates W (for example, 25 substrates) therein is mounted on each of the load ports LP11 to LP14. The container is, for example, a front-opening unified pod (FOUP). A transport robot (not illustrated) that transports the substrate W is disposed in the loader module LM1. The transport robot is configured to be movable along the longitudinal direction of the loader module LM1, and is also configured to be pivotable, extendable/retractable, and movable up and down. The transport robot transports the substrate W based on an operation instruction output by the controller CU1. For example, the transport robot holds the substrate W with a fork disposed at the tip thereof, and transports the substrate W among the load ports LP11 to LP14 and the buffer modules BM11 and BM12.

The substrate processing system PS1 is provided with the controller CU1. The controller CU1 may be, for example, a computer. The controller CU1 includes a central processing unit (CPU), a random access memory (RAM), a read only memory (ROM), an auxiliary storage device, and the like. The CPU operates based on programs stored in the ROM or the auxiliary storage device to control each part of the substrate processing system PS1.

Figure 5:
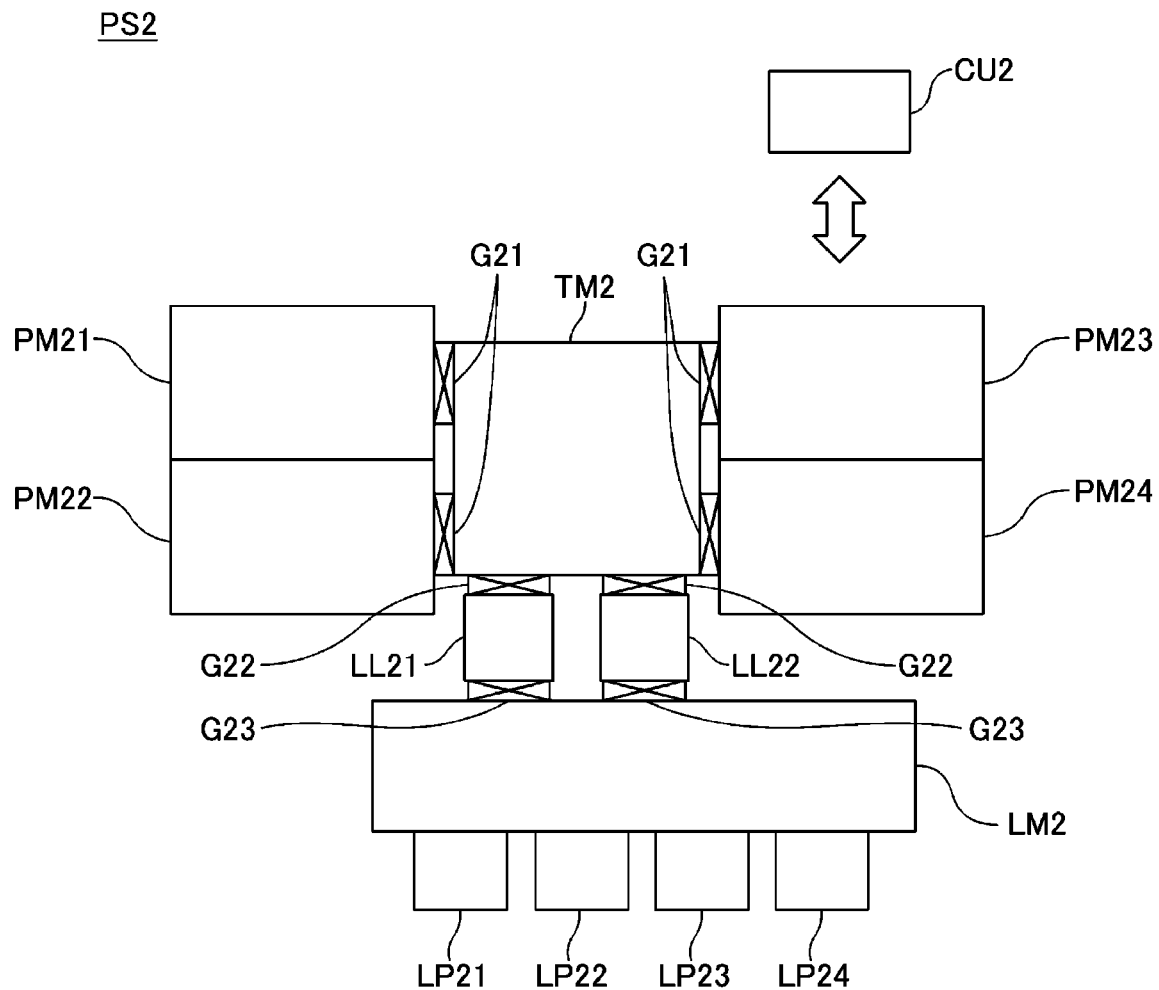
FIG. 5 is a schematic diagram illustrating another example of a substrate processing system.
Figure 6:
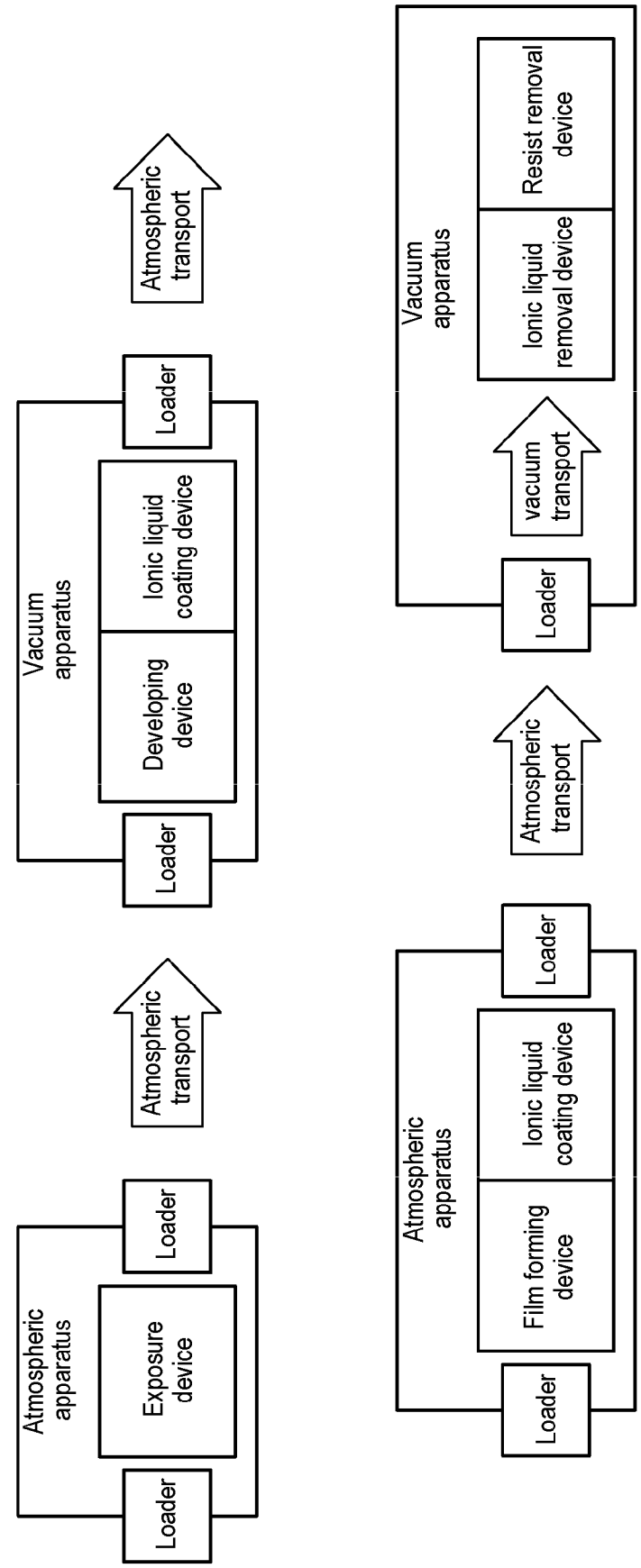
FIG. 6 is a diagram illustrating an example of a process including the substrate processing method.

Another example of a substrate processing system capable of performing the substrate processing method according to the embodiment will be described with reference to FIG. 5. As illustrated in FIG. 5, the substrate processing system PS2 is configured as a vacuum apparatus.

The substrate processing system PS2 includes a vacuum transport module TM2, process modules PM21 to PM24, load lock modules LL21 and LL22, a loader module LM2, and the like.

The vacuum transport module TM2 has a substantially rectangular shape in a plan view. The vacuum transport module TM2 is connected at two opposite side surfaces thereof to the process modules PM21 to PM24. The load lock modules LL21 and LL22 are connected to one side surface of the other two opposite side surfaces of the vacuum transport module TM2. The vacuum transport module TM2 has a vacuum chamber under a vacuum environment, and a transport robot (not illustrated) is disposed therein. The transport robot is configured to be pivotable, extendable/retractable, and movable up and down. The transport robot transports the substrate W based on an operation instruction output by a controller CU2 to be described later. For example, the transport robot holds the substrate W with a fork disposed at a tip thereof, and transports the substrate W among the load lock modules LL21 and LL22 and the process modules PM21 to PM24.

Each of the process modules PM21 to PM24 has a processing chamber and a stage (not illustrated) is disposed therein. The process modules PM21 to PM24 include a film forming device that forms the metal film 12 described above. The film forming device is, for example, a CVD device or a PVD device. The process modules PM21 to PM24 may include devices other than the film forming device. The vacuum transport module TM2 and the process modules PM21 to PM24 are partitioned by gate valves G21 that may be opened and closed.

The load lock modules LL21 and LL22 are arranged between the vacuum transport module TM2 and the loader module LM2. The load lock modules LL21 and LL22 have an internal pressure variable chamber, the interior of which is switchable between vacuum and the atmospheric pressure. Each of the load lock modules LL21 and LL22 has a stage (not illustrated) disposed therein. When loading the substrate W from the loader module LM2 to the vacuum transport module TM2, the load lock modules LL21 and LL22 receive the substrate W from the loader module LM2 while maintaining the interior thereof at the atmospheric pressure, and loads the substrate W to the vacuum transport module TM2 while lowering the pressure of the interior thereof. When unloading the substrate W from the vacuum transport module TM2 to the loader module LM2, the load lock modules LL21 and LL22 receive the substrate W from the vacuum transport module TM2 while maintaining the interior thereof in vacuum, and loads the substrate W to the loader module LM2 while raising the pressure of the interior thereof to the atmospheric pressure. The load lock modules LL21 and LL22 and the vacuum transport module TM2 are partitioned by gate valves G22 that may be opened and closed. The load lock modules LL21 and LL22 and the loader module LM2 are partitioned by gate valves G23 that may be opened and closed.

The loader module LM2 is arranged opposite to the vacuum transport module TM2. The loader module LM2 is, for example, an EFEM. The loader module LM2 has a rectangular parallelepiped shape, includes an FFU, and is an atmospheric transport chamber maintained under an atmospheric pressure environment. Two load lock modules LL21 and LL22 are connected to one longitudinal side surface of the loader module LM2. Load ports LP21 to LP24 are connected to the other longitudinal side surface of the loader module LM2. A container (not illustrated) that accommodates multiple substrates W (for example, 25 substrates) therein is mounted on each of the load ports LP21 to LP24. The container is, for example, a FOUP. A transport robot (not illustrated) that transports the substrate W is disposed in the loader module LM2. The transport robot is configured to be movable along the longitudinal direction of the loader module LM2, and is also configured to be pivotable, extendable/retractable, and movable up and down. The transport robot transports the substrate W based on an operation instruction output by the controller CU2. For example, the transport robot holds the substrate W with a fork disposed at the tip thereof, and transports the substrate W among the load ports LP21 to LP24 and the load lock modules LL21 and LL22.

The substrate processing system PS2 is provided with the controller CU2. The controller CU2 may be, for example, a computer. The controller CU2 includes a CPU, a RAM, a ROM, an auxiliary storage device, and the like. The CPU operates based on programs stored in the ROM or the auxiliary storage device to control each part of the substrate processing system PS2.

[Semiconductor Manufacturing Process Including Substrate Processing Method]

An example of a semiconductor manufacturing process to which the substrate processing method according to the embodiment is applicable will be described with reference to FIGS. 6 to 15.

Figure 7:
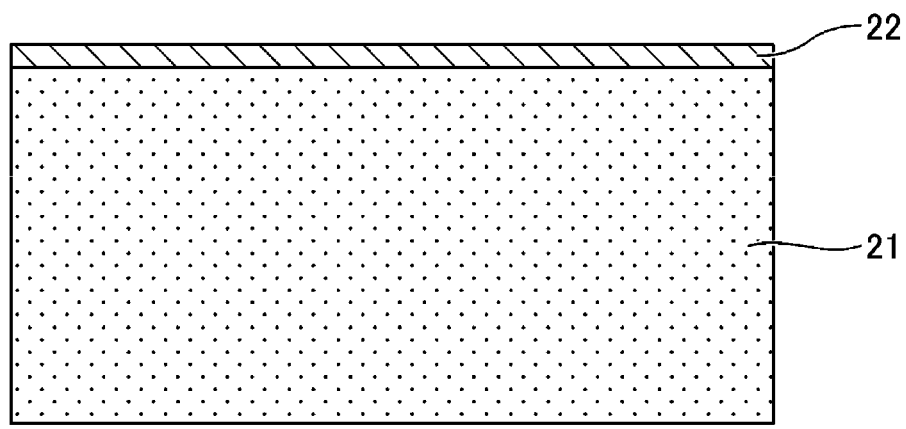
FIG. 7 is a cross-sectional view (1) illustrating an example of the process including the substrate processing method.
Figure 8:
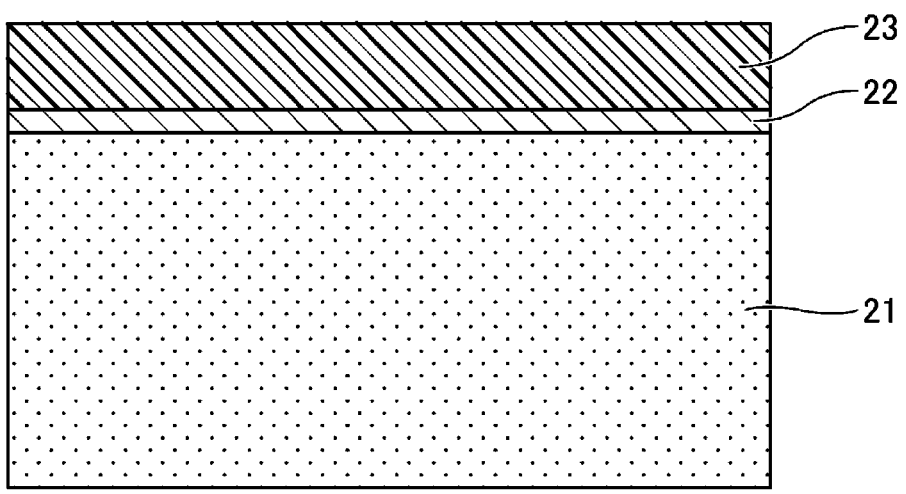
FIG. 8 is a cross-sectional view (2) illustrating an example of the process including the substrate processing method.

First, a copper film 22 is formed on a surface of a substrate 21 by electroless plating (see FIG. 7). The thickness of the copper film is, for example, 0.5 µm. Next, a resist film 23 is formed on the copper film 22 by coating (see FIG. 8).

Figure 9:
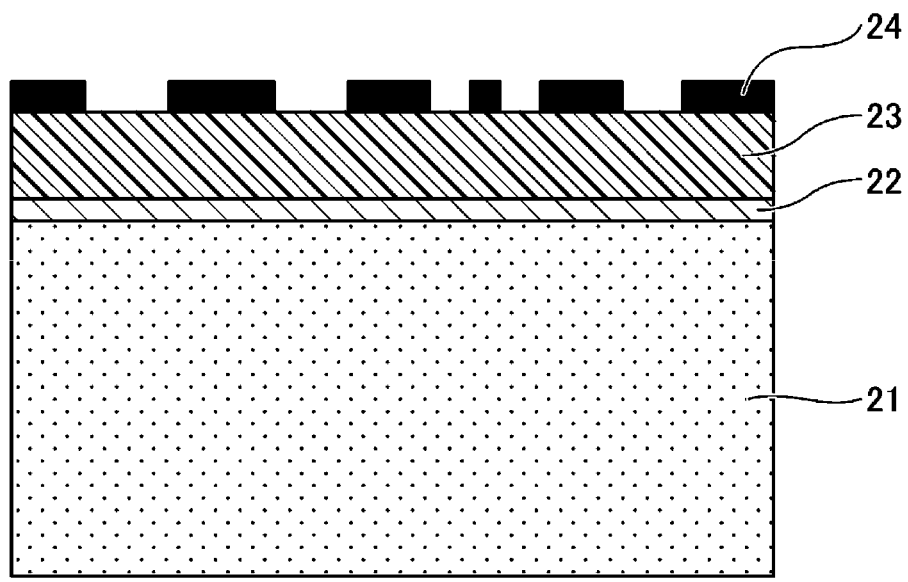
FIG. 9 is a cross-sectional view (3) illustrating an example of the process including the substrate processing method.
Figure 10:
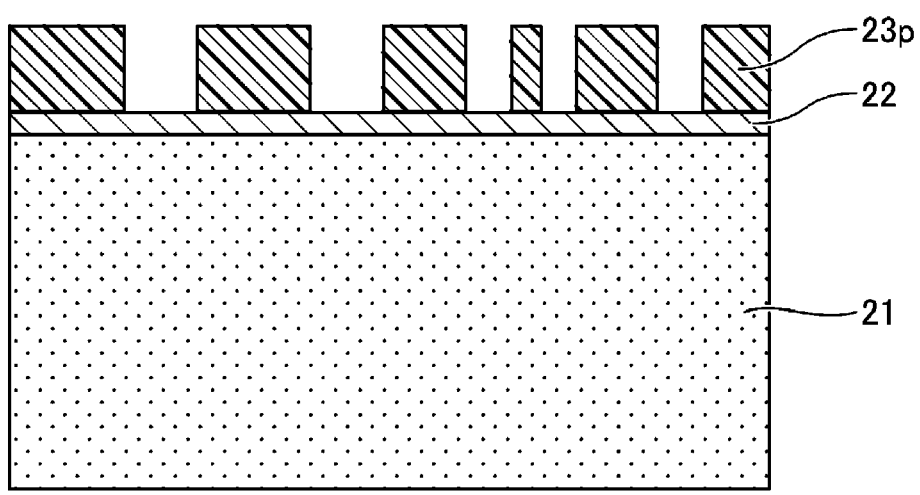
FIG. 10 is a cross-sectional view (4) illustrating an example of the process including the substrate processing method.

Next, the substrate 21 having the resist film 23 formed thereon is transported to an exposure device in an atmospheric apparatus via a loader, and the exposure device performs an exposure processing of exposing a part of the resist film 23 using a photomask 24 (see FIG. 9). The exposure device may be, for example, any of the process modules PM11 to PM14 in the substrate processing system PS1.

Next, the substrate 21 subjected to the exposure processing is unloaded from the atmospheric apparatus via the loader, and is transported into a vacuum apparatus via a loader by an atmospheric transport mechanism. Next, the substrate 21 transported into the vacuum apparatus is transported to a developing device in the vacuum apparatus, and the developing device forms a resist pattern 23p having an opening that exposes a part of the copper film 22 by developing the resist film 23 (see FIG. 10). The developing device may be, for example, any of the process modules PM21 to PM24 in the substrate processing system PS2.

Figure 11:
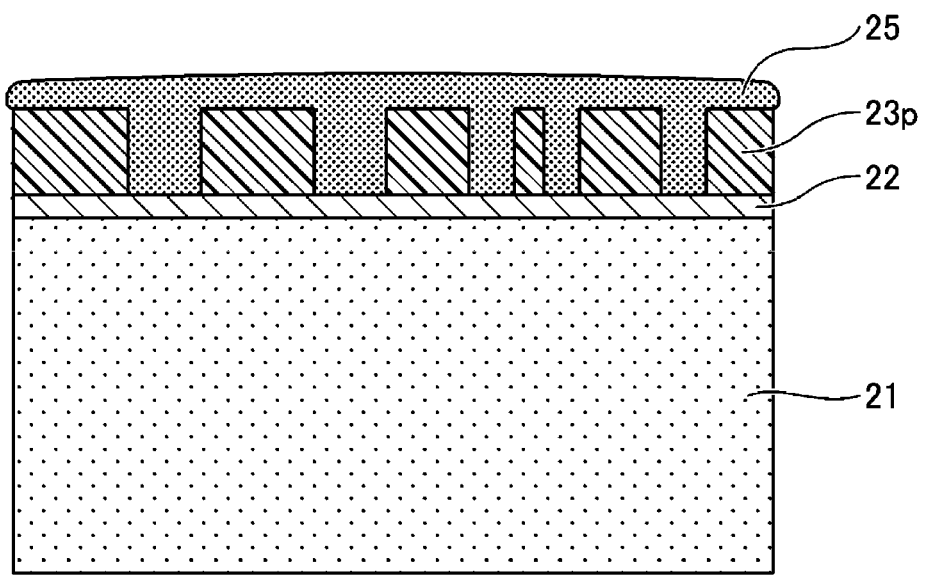
FIG. 11 is a cross-sectional view (5) illustrating an example of the process including the substrate processing method.
Figure 12:
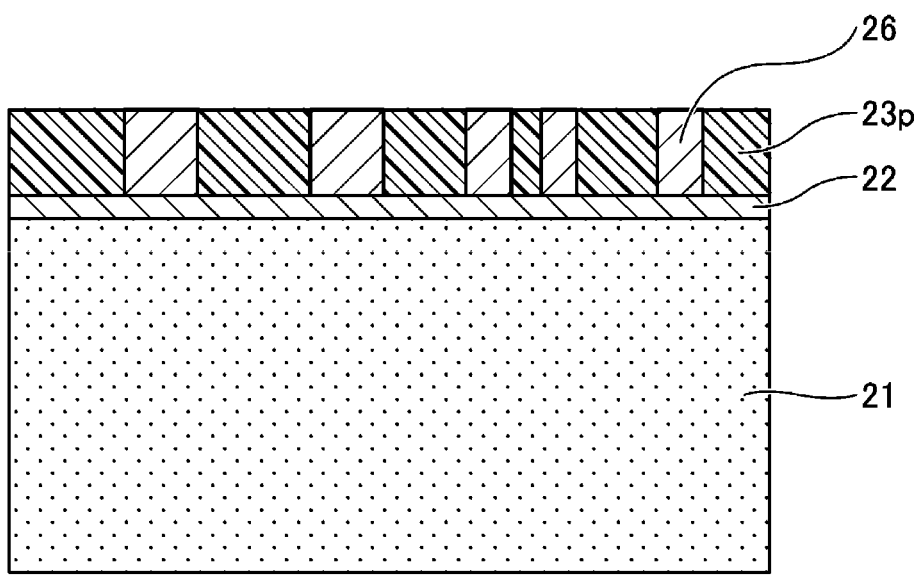
FIG. 12 is a cross-sectional view (6) illustrating an example of the process including the substrate processing method.

Next, the substrate 21 is transported from the developing device to an ionic liquid coating device, and the ionic liquid coating device forms an ionic liquid film 25 by applying an ionic liquid onto the resist pattern 23p (see FIG. 11). When forming the ionic liquid film 25, it is preferable to apply the substrate processing method according to the above-described embodiment. Thereby, the ionic liquid film 25 functions as a protective film for water and oxygen, and prevents water and oxygen from reaching the copper film 22. As a result, corrosion of the surface of the copper film 22 may be prevented. The ionic liquid coating device may be, for example, any of the process modules PM21 to PM24 in the substrate processing system PS2. Further, the ionic liquid film 25 may be formed by the developing device.

Next, the substrate 21 having the ionic liquid film 25 formed thereon is unloaded from the vacuum apparatus via the loader, and is transported into the atmospheric apparatus via the loader by the atmospheric transport mechanism. Next, the substrate 21 transported into the atmospheric apparatus is transported to a film forming device in the atmospheric apparatus, and the film forming device forms a metal film 26 by performing a film forming processing on the substrate 21 (see FIG. 12). The film forming processing is, for example, a plating processing. At this time, electrolytic plating using an ionic liquid may be performed since the ionic liquid has conductivity. Further, electroless plating may be performed. In addition, the ionic liquid film 25 applied to the surface of the substrate 21 may be washed (by replacement washing) and removed before performing the film forming processing in the film forming device. Further, if the film forming processing is a plating processing, the ionic liquid film 25 may be replaced (i.e., replaced by washing) with an ionic liquid in which a metal to be formed into a film is dissolved. The film forming device may be, for example, any of the process modules PM11 to PM14 in the substrate processing system PS1.

Figure 13:
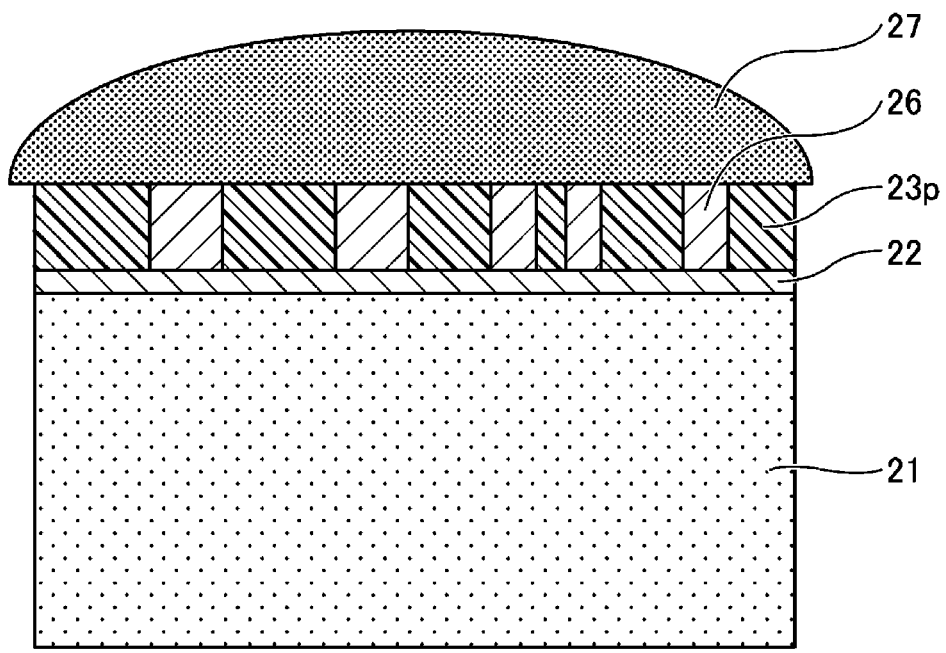
FIG. 13 is a cross-sectional view (7) illustrating an example of the process including the substrate processing method.
Figure 14:
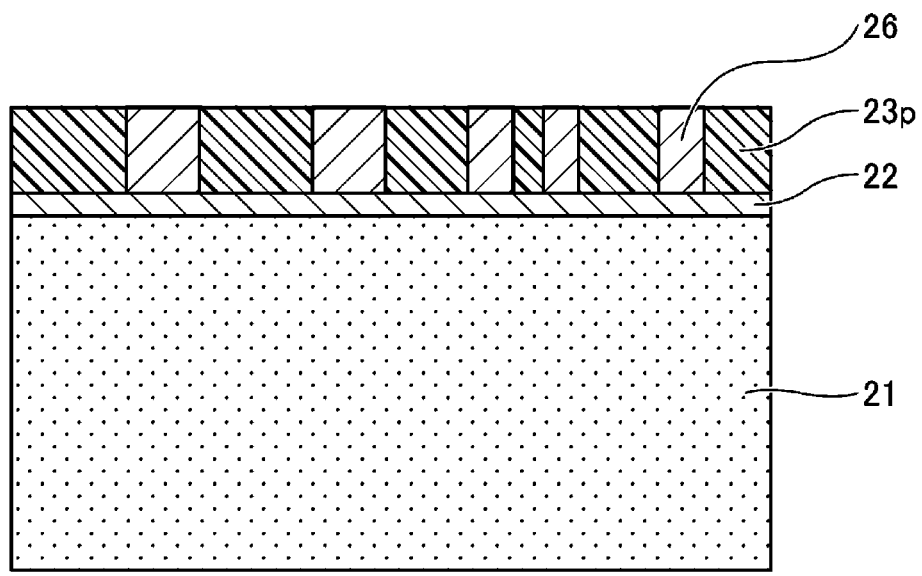
FIG. 14 is a cross-sectional view (8) illustrating an example of the process including the substrate processing method.

Next, the substrate 21 is transported from the film forming device to the ionic liquid coating device, and the ionic liquid coating device forms an ionic liquid film 27 by applying an ionic liquid onto the metal film 26 (see FIG. 13). When forming the ionic liquid film 27, it is preferable to apply the substrate processing method according to the above-described embodiment. Thereby, the ionic liquid film 27 functions as a protective film for water and oxygen, and prevents water and oxygen from reaching the metal film 26. As a result, corrosion of the surface of the metal film 26 may be prevented. The ionic liquid coating device may be, for example, any of the process modules PM11 to PM14 in the substrate processing system PS1. In addition, the ionic liquid film 27 may be formed by the film forming device.

Next, the substrate 21 having the ionic liquid film 27 formed thereon is unloaded from the atmospheric apparatus via the loader, and is transported into the vacuum apparatus via the loader by the atmospheric transport mechanism. Next, the substrate 21 transported into the vacuum apparatus is transported to an ionic liquid removal device in the vacuum apparatus, and the ionic liquid removal device removes the ionic liquid film 27 (see FIG. 14). The ionic liquid removal device may be, for example, any of the process modules PM21 to PM24 in the substrate processing system PS2.

Figure 15:
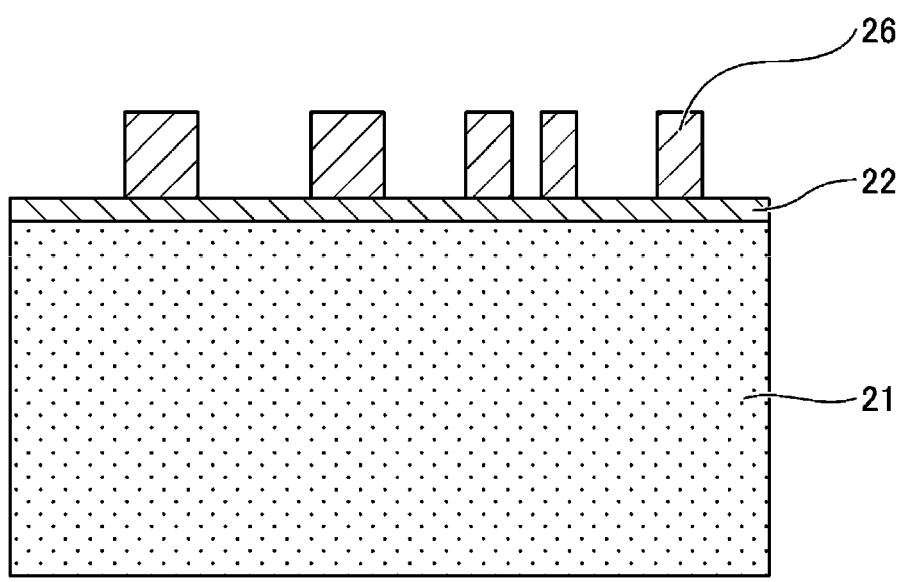
FIG. 15 is a cross-sectional view (9) illustrating an example of the process including the substrate processing method.

Next, the substrate 21 is transported from the ionic liquid removal device to a resist removal device, and the resist removal device removes the resist pattern 23p by ashing or the like (see FIG. 15). The resist removal device may be, for example, any of the process modules PM21 to PM24 in the substrate processing system PS2. In addition, the resist pattern 23p may be removed by the ionic liquid removal device.

In addition, the loader of the atmospheric apparatus may be, for example, any of the load ports LP11 to LP14 in the substrate processing system PS1. The loader of the vacuum apparatus may be, for example, any of the load ports LP21 to LP24 in the substrate processing system PS2.

[Analysis Result]

A result of analyzing a mixed state of EMIm-AcO, which is a first ionic liquid, and BHDP-DSS, which is a second ionic liquid, will be described with reference to FIGS. 16 and 17. It was confirmed that the analysis of the mixed state uses LAMMPS, which is a solver for molecular dynamics (MD) simulation, and the two kinds of ionic liquids (EMIm-AcO and BHDP-DSS) are phase-separated (not mixed) even after a long period of time has passed.

Figure 16:
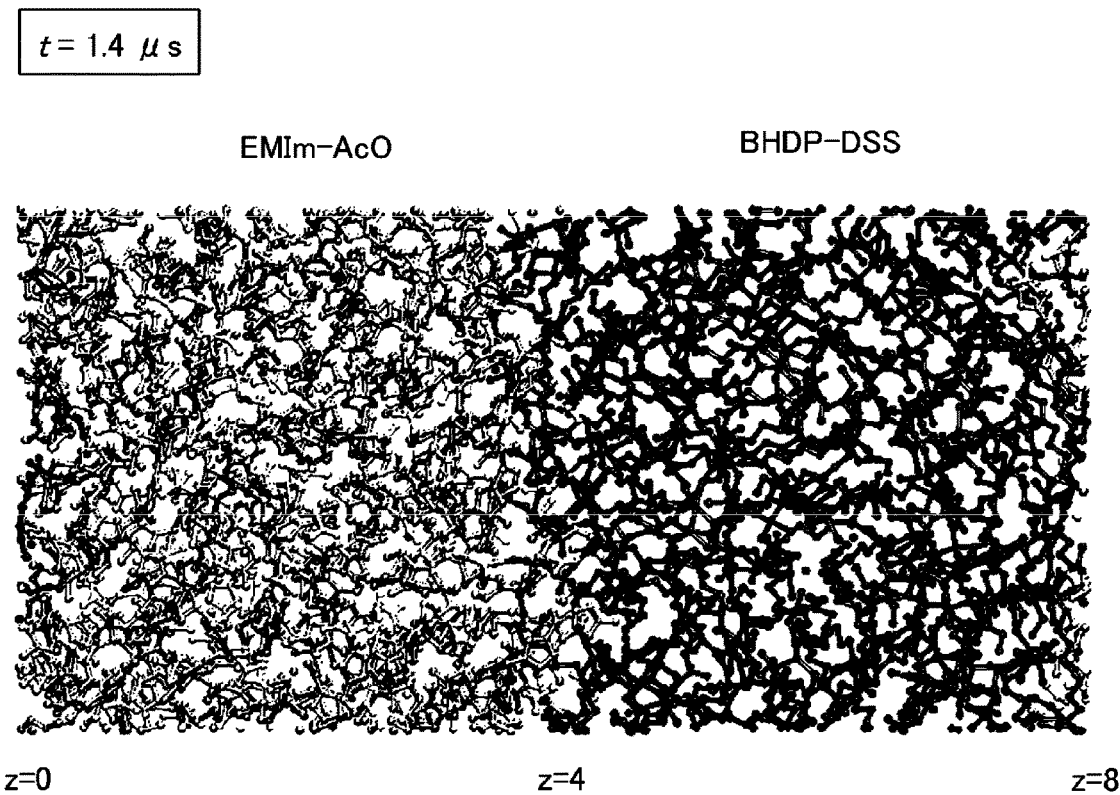
FIG. 16 is a diagram (1) illustrating an analysis result of the mixed state of an ionic liquid.

FIG. 16 is an analysis result illustrating the mixed state of EMIm-AcO and BHDP-DSS at 25 degrees C., and illustrates the mixed state at the point in time ($t=1.4$ μs) when 1.4 μs have passed after EMIm-AcO and BHDP-DSS were mixed.

As illustrated in FIG. 16, it can be seen that EMIm-AcO and BHDP-DSS are phase-separated at the time $t=1.4$ μs. It was found from this result that EMIm-AcO and BHDP-DSS are ionic liquids that do not mix spontaneously.

Figure 17:
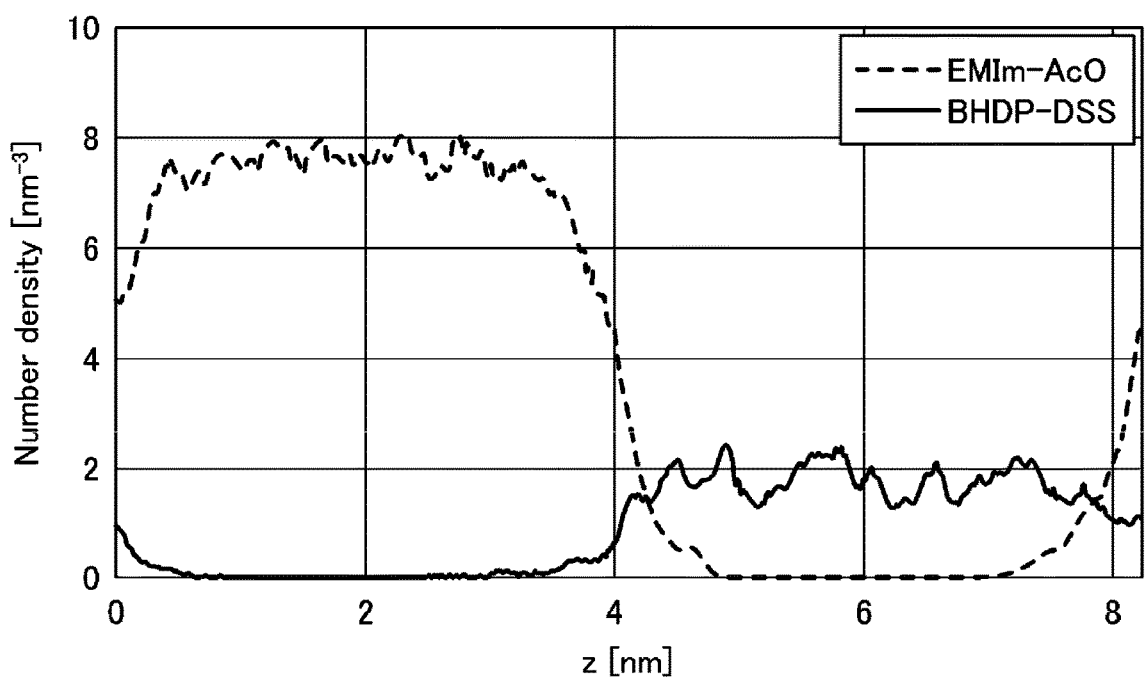
FIG. 17 is a diagram (2) illustrating an analysis result of the mixed state of an ionic liquid.

FIG. 17 is an analysis result illustrating the mixed state of EMIm-AcO and BHDP-DSS at 25 degrees C., and illustrates the density distribution of EMIm-AcO and BHDP-DSS. In FIG. 17, the horizontal axis represents a position z [nm] in the stacking direction of EMIm-AcO and BHDP-DSS in FIG. 16. The vertical axis represents a time average value of the number density [$nm^{-3}$] of EMIm-AcO and BHDP-DSS at the time $t=0$ to 1.4 μs. In FIG. 17, the broken line indicates the result of EMIm-AcO, and the solid line indicates the result of BHDP-DSS.

As illustrated in FIG. 17, it can be seen that at positions $z=1$ nm to 3 nm, the number density of EMIm-AcO is 7 $nm^{-3}$ to 8 $nm^{-3}$, whereas the number density of BHDP-DSS is approximately 0 $nm^{-3}$. That is, it can be seen that BHDP-DSS does not exist or almost does not exist and EMIm-AcO exists at positions $z=1$ nm to 3 nm. It can be seen that at positions $z=5$ nm to 7 nm, the number density of EMIm-AcO is approximately 0 $nm^{-3}$, whereas the number density of BHDP-DSS is 1 $nm^{-3}$ to 3 $nm^{-3}$. That is, it can be seen that EMIm-AcO does not exist or almost does not exist, and only BHDP-DSS exists at positions $z=5$ nm to 7 nm. It was found from these results that EMIm-AcO and BHDP-DSS are ionic liquids that do not mix spontaneously.

The embodiments disclosed herein should be considered to be exemplary and not limitative in all respects. The above embodiments may be omitted, replaced or modified in various embodiments without departing from the scope of the appended claims and their gist.

In the above embodiments, the case of forming an ionic liquid film on the surface of a metal film by supplying a hydrophilic first ionic liquid and a hydrophobic second ionic liquid that do are not mix spontaneously to the surface of a substrate has been described, but the present disclosure is not limited thereto. For example, an ionic liquid crystal film may be formed on the surface of the metal film by supplying an ionic liquid crystal having a hydrophilic group and a hydrophobic group to the surface of the substrate. Since different properties of hydrophilic and hydrophobic layers are formed in the ionic liquid crystal having a hydrophilic group and a hydrophobic group, the same effect as when using the hydrophilic first ionic liquid and the hydrophobic second ionic liquid that do not mix spontaneously described above may be exhibited with even one kind of ionic liquid crystal.

The ionic liquid crystal is a material that contains cations and anions and exhibits at least one liquid crystal phase.

An example of cations contained in the ionic liquid crystal may include ions containing Cn ($n \geq 8$) such as Cnmim ($n \geq 12$), CnHim ($n \geq 8$), and Cnmpyrr ($n \geq 12$).

An example of anions constituting the ionic liquid crystal may include Cl, Br, $NO_3$, $BF_4$, $PF_6$, OTf [trifluoromethanesulfonate (triflate)], and SCN [thiocyanate].

Further, in the embodiment, the ionic liquid containing the hydrophilic first ionic liquid and the hydrophobic second ionic liquid that do not mix spontaneously and the ionic liquid crystal having a hydrophilic group and a hydrophobic group are an example of ionic self-association material having fluidity with a hydrophilic group and a hydrophobic group.

According to the present disclosure in some embodiments, it is possible to prevent corrosion of the surface of a metal film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
preparing a substrate having a metal film exposed on a surface of the substrate; and
forming a film of an ionic self-association material on a surface of the metal film by supplying the ionic self-association material to the surface of the substrate,
wherein the ionic self-association material includes a hydrophilic group and a hydrophobic group, each of which has fluidity, and
wherein the ionic self-association material comprises a hydrophilic ionic liquid and a hydrophobic ionic liquid that do not mix spontaneously.

2. The substrate processing method of claim 1, wherein the hydrophilic ionic liquid and the hydrophobic ionic liquid have a radius of a Hansen sphere of 10 $Mpa^{1/2}$ or more.

3. The substrate processing method of claim 2, wherein the hydrophilic ionic liquid and the hydrophobic ionic liquid have a radius of a Hansen sphere of 20 $Mpa^{1/2}$ or more.

4. The substrate processing method of claim 3, wherein the hydrophilic ionic liquid includes at least one of DEME-$BF_4$, EMIm-TFA, EMIm-AcO, MEMP-alanine, MEMP-BF$(CN)_3$, or EMIm-$NO_3$, and
wherein the hydrophobic ionic liquid includes at least one of BHDP-DSS, BDDP-DSS, MEMP-TFSA, MEMP-FSA, or P13-FSA.

5. The substrate processing method of claim 4, wherein the forming the film includes supplying the hydrophilic ionic liquid and the hydrophobic ionic liquid from a same nozzle.

6. The substrate processing method of claim 5, wherein the preparing the substrate includes removing a natural oxide film formed on at least one of the metal film exposed on the surface of the substrate or the surface of the substrate.

7. The substrate processing method of claim 1, wherein the forming the film includes supplying the hydrophilic ionic liquid and the hydrophobic ionic liquid from different nozzles.

8. The substrate processing method of claim 1, wherein the preparing the substrate includes removing a natural oxide film formed on at least one of the metal film exposed on the surface of the substrate or the surface of the substrate.

9. The substrate processing method of claim 1, wherein the ionic self-association material includes an ionic liquid crystal having a hydrophilic group and a hydrophobic group.

* * * * *